(12) United States Patent
Kaneko

(10) Patent No.: US 7,682,472 B2
(45) Date of Patent: Mar. 23, 2010

(54) METHOD FOR CASTING POLYCRYSTALLINE SILICON

(75) Inventor: Kyojiro Kaneko, Kainan (JP)

(73) Assignee: Sumco Solar Corporation, Wakayama (JP)

( * ) Notice: Subject to any disclaimer, the term of this patent is extended or adjusted under 35 U.S.C. 154(b) by 147 days.

(21) Appl. No.: 11/503,963

(22) Filed: Aug. 15, 2006

(65) Prior Publication Data
US 2007/0039544 A1  Feb. 22, 2007

(30) Foreign Application Priority Data
Aug. 18, 2005  (JP) .............................. 2005-237608

(51) Int. Cl.
*B22D 17/00* (2006.01)
(52) U.S. Cl. .................................. 148/538; 164/483
(58) Field of Classification Search ................. 148/538; 164/483
See application file for complete search history.

(56) References Cited

U.S. PATENT DOCUMENTS

| | | | |
|---|---|---|---|
| 4,572,812 A | 2/1986 | Ciszek | |
| 4,915,723 A * | 4/1990 | Kaneko et al. | .............. 65/144 |
| 5,454,424 A | 10/1995 | Mori et al. | |

FOREIGN PATENT DOCUMENTS

| | | | |
|---|---|---|---|
| JP | 61-52962 | | 3/1986 |
| JP | 63-192543 | | 8/1988 |
| JP | 02-030698 | | 2/1990 |
| JP | 02-051493 | | 2/1990 |
| JP | 05-123836 | * | 5/1993 |
| JP | 09-094639 | | 4/1997 |

OTHER PUBLICATIONS

Translation and East Abstract of JP 09-094639 Apr. 8, 1997.*

* cited by examiner

*Primary Examiner*—Jessica L. Ward
*Assistant Examiner*—Nicholas P D'Aniello
(74) *Attorney, Agent, or Firm*—Clark & Brody

(57) ABSTRACT

In melting and casting by a water-cooled crucible induction melting technique, a partition means is inserted on top portion of a melt, and a new raw material for is charged on an upper side of the partition means to continue the melting and casting. Therefore, the continuous casting can be kept while avoiding mixture of the melt on a lower side of with the melt on an upper side of the partition means. A partition plate or a partition plate with legs can be used as the partition means. When the present invention is applied to production of a silicon ingot used for a solar cell and the like, productivity is largely improved, which allows costs to be remarkably reduced in solar energy generation. Therefore, the present invention can widely be utilized as the method for casting a polycrystalline-silicon ingot for a solar cell.

2 Claims, 3 Drawing Sheets

US 7,682,472 B2

METHOD FOR CASTING POLYCRYSTALLINE SILICON

FIELD OF THE INVENTION

The present invention relates to a method for casting polycrystalline silicon in which an ingot is continuously produced to be used for a solar cell substrate.

DESCRIPTION OF THE RELATED ART

A silicon crystal is used as a substrate material in most (at least 90%) of the currently produced solar cells. The silicon crystal includes a single crystal and a polycrystal. Generally the solar cell having high conversion efficiency can be obtained by using the single crystal as the substrate, when light energy incident to the solar cell is converted into electrical energy.

Because a high grade, less-defect, dislocation-free, single crystal having the same grade as the substrate material of a semiconductor integrated circuit is required in the single crystal used for the solar cell, the solar-cell single crystal is produced by a Czochralski method in which the single crystal is pulled from molten silicon, which causes production cost to be increased to raise power generation price.

On the other hand, the polycrystalline silicon is produced by a casting method of solidifying the molten silicon in a mold. The casting method can produce the substrate material at lower cost compared with the Czochralski method. Therefore, for the purpose of the quality enhancement and production cost reduction of the solar cell in which the polycrystalline silicon is used as the substrate, various studies are being made on improvement of the methods for melting and casting the polycrystalline silicon.

In casting the polycrystalline silicon, the high-purity silicon which is of a raw material is heated and melted in a crucible, a trace amount of boron which is of a dopant is added and homogenized, and the molten silicon is directly solidified in the crucible or the molten silicon is solidified by pouring the molten silicon in the mold.

A quartz crucible is used in melting silicon. The crucible, in which the melt is solidified after the silicon is melted, having a square shape of cross section is used because the solar cell substrate has the square shape. A graphite mold having the square shape of cross section is used as a mold in which the melt is poured.

When silicon is melted in the quartz crucible, the molten silicon comes into contact with a crucible wall to have oxygen therein mix into the molten silicon. Part of the mixed oxygen becomes SiO, and SiO is vaporized and lost. The SiO remaining in some degree brings about an effect of increasing mechanical strength of the crystalline silicon. However, excessive mixture of oxygen is not desirable because electrical properties of the solar cell substrate are degraded. In the case where the mold is made of graphite, in order to avoid the direct contact between the graphite and the melt, the surface of the graphite is coated with silicon nitride powders or the like which do not react with the molten silicon is applied to the graphite mold.

When the silicon melt is solidified to make the ingot, unidirectional solidification is adopted in order not only to grow a large crystal grain but also to prevent cracking caused by volume expansion associated with the solidification.

In the unidirectional solidification, for example, in the case where the mold is used, a cooling plate which is water-cooled is placed at a bottom of the mold, a side wall and an upper portion of the mold are kept warm or heated at the same time, and the solidification progresses upward from the bottom of the mold. In the case where the solidification is performed in the crucible, the solidification gets started by bringing the cooling plate into contact with the bottom of the crucible after silicon is heated and melted, and the crucible is gradually withdrawn downward from a hot zone formed by a heater, and the solidification progresses upward from the bottom of the crucible.

In order to prevent mixture of an impurity from atmosphere or oxidation by atmospheric air, the melting and the casting are performed in an inert atmosphere at atmospheric pressure or reduced pressure in an air-tight sealed chamber.

However, in the casting method in which the crucible and the mold are used, it is difficult to prevent the impurity contamination caused by bringing silicon into contact with the chamber wall or it is difficult to prevent the mixture of oxygen from the quartz crucible. To cope with these problems, there is developed a cooled crucible induction melting-casting method in which the silicon crystal can be cast while the molten silicon is hardly brought into contact with the crucible or the mold.

For example, Japanese Patent Application Publication No. 61-52962 discloses a casting method in which, in an apparatus structure, electroconductive oblong-like strips (usually made of copper) having good thermal conductivity are arranged in an inner side of a high-frequency induction coil. The oblong-like strips are electrically insulated from one another in a circumferential direction, and the inside of each of the oblong-like strips is water-cooled. A portion surrounded by the oblong-like strips becomes a melting chamber (crucible). A sectional shape of the coil and a sectional shape of the portion surrounded by the oblong-like strips may be formed in a circle or a square. A support base which can be moved downward is provided below the above fixture. When the raw material of silicon is charged in the water-cooled copper crucible functioning as the melting chamber and the alternating current is supplied to the high-frequency induction coil, because each of the oblong-like strips constituting the water-cooled copper crucible is electrically isolated, the current forms a loop within each strip, and the current on the inner-wall side of the water-cooled copper crucible forms a magnetic field in the water-cooled copper crucible, which allows silicon to be heated and melted in the crucible. The molten silicon receives inward force normal to the inside of the molten silicon surface by an interaction of the magnetic field generated by the current in the inner wall of the water-cooled copper crucible and the current in a superficial surface of the molten silicon. Therefore, the molten silicon is melted without being in contact with the crucible.

On the above-described operation principle, when the support base which supports the molten silicon and the ingot is gradually moved downward while silicon is melted in the crucible, because the induction magnetic field is decreased as silicon is separated away from a lower end of the high-frequency induction coil, the current is decreased to weaken the heat generation, which allows the solidification to progress upward in the bottom of the molten solution. At the same time, when the melting and the solidification are continued by continuously charging the raw material from above the crucible in accordance with the downward movement of the support base, the polycrystalline silicon is continuously cast by the unidirectional solidification while the molten silicon is not in contact with the crucible wall.

Japanese Patent Application Publication No. 63-192543 discloses a casting method, in which the cast piece is easily withdrawn by configuring the water-cooled crucible shape to have a broader lower end.

Japanese Patent Application Publication No. 2-30698 discloses an improved technique of preventing the contact caused by melt intrusion into a gap between the oblong-like strips constituting the water-cooled crucible, and Japanese Patent Application Publication No. 2-30698 also discloses an improved technique concerning control of cooling conditions during the solidification.

Japanese Patent Application Publication No. 2-51493 discloses an apparatus in which, in the water-cooled crucible induction melting-casting method, the air-tight sealed chamber is set at the inert atmosphere which is pressurized slightly higher than the atmospheric air, a substantially non-contact seal is provided in the lower portion of the air-tight sealed chamber, the continuously cast ingot is continuously withdrawn and mechanically cut outside the air-tight sealed chamber.

SUMMARY OF THE INVENTION

In the polycrystalline silicon casting method, as described above, usually the unidirectional solidification is adopted in order not only to grow the crystal grain to be larger but also to prevent the cracking caused by the volume expansion associated with the solidification.

In the water-cooled crucible induction melting-casting method, the raw material is melted by induction heating, and the melt is withdrawn downward to cause the unidirectional solidification to progress at the time when the raw material is supplied to the crucible to continue the casting. Therefore, the ingot larger than a volume of the melt in the crucible can be produced. Additionally, in the water-cooled crucible induction melting-casting method, because the melt does not come into contact with the crucible wall, there is no danger that the impurity is mixed in the melt, and a life of the crucible can be extended. Accordingly, as disclosed in Japanese Patent Application Publication No. 2-51493, when the ingot is continuously withdrawn while the inside of the chamber is maintained in the inert atmosphere, the continuous casting can be performed without interrupting the melting and the casting. However, usually a segregation effect exists in the metal solidification, and the impurity element dissolved in a liquidus phase differs from the impurity element being soluble in a solidus phase in the concentration during the solidification. Therefore, the impurity element in the ingot differs from the impurity element in the concentration when the melt is solidified.

Usually, when the concentration of the impurity element is small, assuming that $C_S$ is solubility in the solidus phase and $C_L$ is solubility in the liquidus phase, a ratio k of the solubility in the solidus phase and the solubility in the liquidus phase is expressed by the following formula (1), and the ratio k is substantially kept constant. The ratio k is called segregation coefficient.

$$k=C_S/C_L \tag{1}$$

Generally, in silicon, the segregation coefficient k of the impurity element is smaller than one (1). Therefore, when the solidification is slowly performed such that an equilibrium state is maintained in the segregation, the impurity concentration in the solidified ingot is smaller than the impurity concentration in the melt. Therefore, the impurity element concentration is smaller than the impurity element concentration in the melt. At the same time, the impurity is gradually condensed in the melt when the melting and casting are continued while the raw material is charged. As a result, the melt containing the impurity whose concentration is higher than that of the charged raw material is generated, and the impurity concentration thus made is transferred and distributed into the cast ingot under solidification in due course. When the impurity concentration increases in the ingot, performance of a semiconductor device is degraded.

In the conventional silicon ingot production by the electromagnetic casting, when the long-length ingot is produced, the impurity concentration is increased in the melt, and the impurity concentration of the ingot is simultaneously increased. Therefore, it is obliged to cease the casting to cool down and disassemble the furnace. That is, the productivity becomes worsened in the silicon electromagnetic casting method due to the time necessary to cool down and disassemble the furnace.

The present invention relates to a method for casting a polycrystalline-silicon in which the impurity concentration of the melt is addressed when continuous melting and casting are carried out in the method of silicon water-cooled crucible induction melting casting, and the object thereof is to provide a method for casting polycrystalline silicon used in the solar cell substrate, wherein the impurity element concentrated portion can be removed without disturbing the continuous melting and casting operation.

The present invention is made to solve the above problem, and the gist of the invention pertains to the method for casting polycrystalline silicon.

A method according to the present invention for casting polycrystalline silicon by a water-cooled crucible induction melting technique, wherein partition means is inserted on top portion of a melt, a new melting raw material is charged on an upper side of the partition means to continue melting and casting; and the continuous casting is continued while mixture of the melt on a lower side of the partition means and the melt on an upper side of the partition means is prevented. In the polycrystalline-silicon casting method of the present invention, the partition means may be configured to be a partition plate or a partition plate to which legs are attached.

According to the method for casting polycrystalline-silicon by the present invention, in the production of the silicon ingot used for the solar cell, the productivity is largely improved, which allows manufacturing cost to be remarkably reduced. Therefore, the production cost of the solar energy generation apparatus can be decreased.

DETAILED DESCRIPTION OF THE PREFERRED EMBODIMENTS

Figure 1:
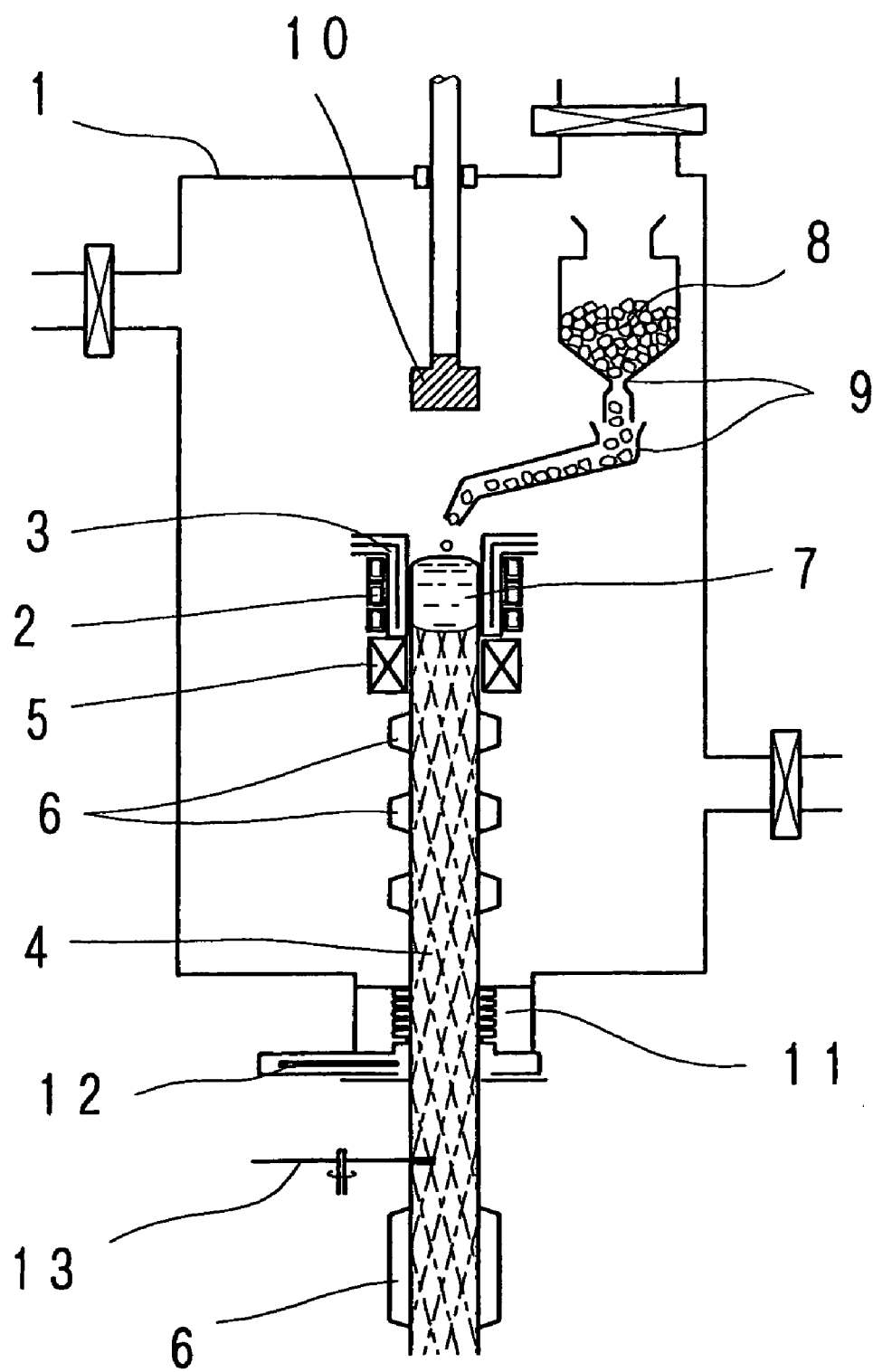
FIG. 1 schematically shows a configuration of a water-cooled crucible induction melting-casting apparatus to which a method for casting polycrystalline-silicon according to the present invention can be applied.

FIG. 1 schematically shows a configuration of a water-cooled crucible induction melting-casting apparatus to which a method for casting polycrystalline-silicon according to the present invention can be applied. In the apparatus of FIG. 1, a copper oblong-like strip 3 is provided inside an induction heating coil 2, and a crucible is formed by the oblong-like strips 3. Each of the copper oblong-like strip 3 is isolated from each other in the circumferential direction, is configured to be long in the vertical direction, and the inside of the copper oblong-like strip 3 is water-cooled. The silicon is melted while being not in contact with the copper oblong-like strips 3 by passing the current through the induction heating coil 2. When molten silicon 7 is gradually withdrawn downward, the molten silicon 7 goes out from the induction heating coil 2 to weaken the heating, and reversely the molten silicon 7 is cooled. Therefore, the unidirectional solidification progresses upward from the lower portion. A polycrystalline silicon ingot 4 is continuously produced, when an amount of silicon raw material 8 equivalent to the ingot withdrawn is simultaneously supplied through a supply device 9 from above the crucible.

Because silicon is chemically active in the molten state, in order to prevent the oxidation and the impurity uptake, a melting and casting operation is performed in a air-tight sealed chamber 1, and the inside of the air-tight sealed chamber 1 is maintained in an argon atmosphere at atmospheric pressure or reduced pressure.

In a procedure of performing the electromagnetic casting in the air-tight sealed chamber 1, the silicon raw material is intermittently supplied from the outside of the air-tight sealed chamber 1 to the supply device 9 in the air-tight sealed chamber 1, the silicon raw material is melted, cast, and cooled to continuously withdraw the ingot downward. However, the casting operation is ended when a length of the ingot reaches a length of the air-tight sealed chamber 1 with the progress of the downward withdrawing of the ingot. After the casting operation is ended, the furnace is cooled, the ingot is taken out, and a preparation operation for the next casting is performed. The interruption of the casting operation becomes a big obstacle against the improvement of the productivity of in the silicon electromagnetic casting.

The electromagnetic casting method in which the casting can continuously be performed is proposed as the means for solving the above problem. In the electromagnetic casting method, for example, a discharge port is provided at a position coaxial with an ingot withdrawing direction of the bottom of the air-tight sealed chamber 1. In the discharge port, the sealing between the ingot and the air-tight sealed chamber 1 is performed in a non-contact manner by a labyrinth seal 11. The ingot taken out from the air-tight sealed chamber 1 is mechanically cut to a predetermined length with a diamond cutter 13 which is moved in synchronization with a withdrawing speed.

In the case where the continuous casting is continued by the above method, the impurity is gradually concentrated in the molten silicon in the water-cooled crucible by the segregation effect, and the high-concentration impurity is distributed in the ingot to increase the impurity concentration in the ingot. Therefore, crystal quality of the ingot is decreased.

Conventionally, when the long-length ingot is cast, there are two countermeasures in order to avoid the quality degradation caused by the impurity condensation of the ingot head portion. That is, the casting is stopped at the ingot length in consideration of the impurity concentration in the charged silicon raw material before the impurity reaches the concentration which leads to the quality degradation in the ingot, and the melt portion in which the impurity is condensed is pumped out and removed during the casting and then the casting is continued again.

In the former, the long ingot cannot be cast when the charged raw material has the high impurity concentration. In the latter, the apparatus for pumping out and removing the tens of kilogram chemically active silicon melted at a high temperature and the material used for the apparatus are hardly selected. Therefore, it is not realized in an industrial scale except the case in a small scale. The present inventor studies the method for easily removing the influence of the impurity concentration in the continuous casting operation of the silicon electromagnetic casting, thus ending up in developing the present invention.

That is, the present inventor focuses on the process that partition means is placed on the melt located on the solidified ingot, and the new raw material is charged on the partition means, and then the melting and casting are resumed and continued again, when the impurity is concentrated in the melt to require the removal of the impurity influence.

Figure 2:
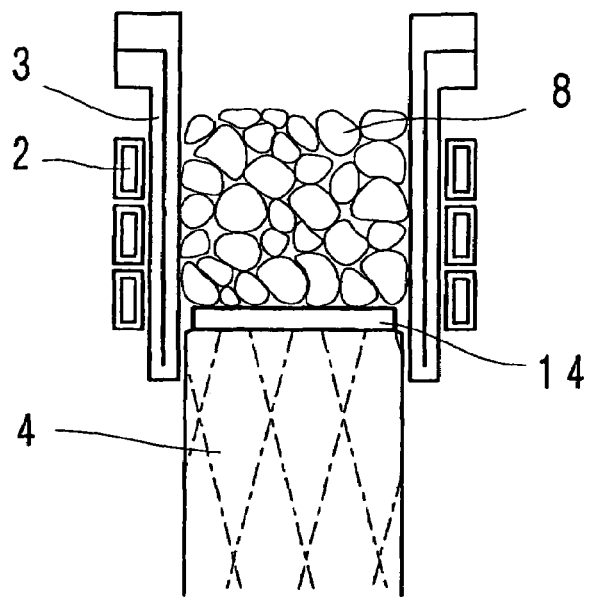
FIG. 2 shows a melting-casting method in which a partition plate is inserted as partition means.

FIG. 2 shows a melting-casting method in which a partition plate is inserted as the partition means. FIG. 2 shows only the crucible portion of FIG. 1. In increasing the impurity concentration in the melt, when the withdrawing is continued while the charging of the raw material is stopped, the upper surface of the melt comes close to the lower end of the induction heating coil 2 to thereby cause the input of heating electric power to decrease, thus completing the solidification. Even if the melt surface happens to be located at higher position within the induction heating coil region, the unidirectional solidification progresses by gradually decreasing the heating electric power.

After the solidification completes up to the upper surface, a refractory partition plate 14 which is of the partition means is placed on the solidified ingot 4 to separate the upper plenum side from the lower ingot side by means of the partition plate 14. For example, silicon nitride quartz glass, and graphite coated with silicon nitride can be used as the material of the partition plate. Although the material of the partition plate is not particularly limited, it is necessary that the material of the partition plate have a melting point sufficiently higher than that of the molten silicon, and it is necessary that the material of the partition plate inhibits the chemical reaction with the molten silicon so as not to contaminate the molten silicon. Desirably a size of the partition plate is slightly smaller than that of a crucible section.

A new raw material 8 for melting is filled on the upper side of the partition plate 14, and a melting output is increased to start melting. In this case, when the melting power happens to be insufficient, the graphite heat generating body 10 shown in FIG. 1 can be placed on the upper surface of the raw material 8 and supplementarily heated, and the graphite heat generating body 10 may be removed when the melting is promoted. Alternatively, the heating supplementarily may be performed using another heat source such as a plasma gas jet.

When the melting of the new raw material gets started, the melting and casting are continued in the same manner as before. Thus, once the temperature is temporarily decreased to insert the partition plate, the raw material is charged to restart the melting, and the impurity concentrated portion and the partition plate are cut and removed in the ingot taken out from the furnace. According to this method, the time in which the continuous casting operation is interrupted can largely be shortened, and the melting and casting operation can be continued.

The reason why the size of the partition plate is set to be slightly smaller than that of the cross section of the crucible portion is that the melt is caused to go around in a gap between the partition plate and the water-cooled crucible to eliminate possible unevenness of the surfaces of the ingot portions sandwiching the partition plate and thereby the effect of the seal portion through which the ingot is taken out to the outside of the furnace is not obstructed.

Figure 3:
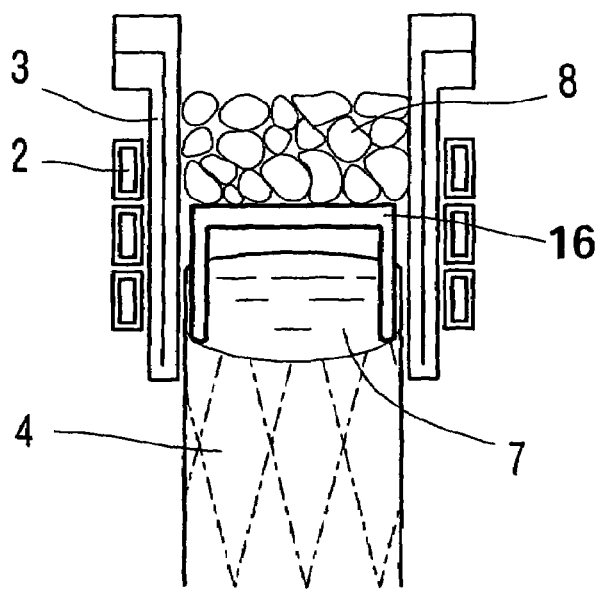
FIG. 3 shows a melting-casting method in which a partition plate with legs is inserted as partition means.

FIG. 3 shows an embodiment of a melting-casting method in which a partition plate with legs is inserted as the partition means. In inserting the partition means, when the whole amount of molten silicon is solidified, the temperature decrease of the ingot and loss of a heat quantity are generated accordingly. Therefore, the energy and the time are largely lost in re-melting a head portion of the ingot including the newly charged silicon raw material. As shown in FIG. 3, a partition plate 16 with legs to the lower portion is used to fix the lower ends of the legs to the solidified portion, and the partition plate may be inserted while the melt remains.

Even in the case where the partition plate shown in FIG. 3 is inserted, in order to ensure the effect of the labyrinth seal, it is desirable to consider the size and shape of the partition plate with legs such that the unevenness is not generated in the surface of the ingot portion into which the partition plate with legs is inserted.

Other than the partition plate in FIG. 2 and the partition plate with legs in FIG. 3, as long as the partition means of the present invention functions as the separation zone between the upper-side melt and lower-side melt, partition cloth made of silicon nitride, quartz glass, or the like can be placed on the solidified ingot, otherwise silicon nitride type material can be sprayed.

EXAMPLES

The polycrystalline silicon ingot was produced with the water-cooled crucible induction melting-casting apparatus whose sectional structure was schematically shown in FIG. 2. The copper water-cooled crucible placed in the heating induction heating coil 2 was configured to be in the square having one side of 170 mm in horizontal section of the inner wall, and the induction heating coil 2 had an effective height of 160 mm.

A silicon ingot (dummy ingot) having the same sectional shape as the ingot and the length of 200 mm was inserted into the crucible such that lower-end position of the induction heating coil 2 was set at the upper surface of the dummy ingot, and the lump-like silicon of the raw material was charged on the dummy ingot. After the chamber was evacuated to a vacuum, argon gas was introduced to the atmospheric pressure, and the melting got started. Because the heat generation of the initial raw material was insufficient at the beginning of the heating, the current is passed while a graphite heat generating body 10 was placed on the upper surface of the raw material in the crucible, and the graphite heat generating body 10 was removed after the melting got started.

The raw material was further supplied, and the downward withdrawing of the ingot got started after the crucible was filled with the melt up to the upper end level of the coil height. Because the melt amount was decreased according to the withdrawing amount, the silicon raw material 8 was supplied such that the melt was maintained at the upper end level of the coil height. For electric conditions in the steady state, the withdrawing speed was 1.5 mm/min, the induction frequency was 30 kHz, and the heating electric power was 250 kW.

Figure 4:
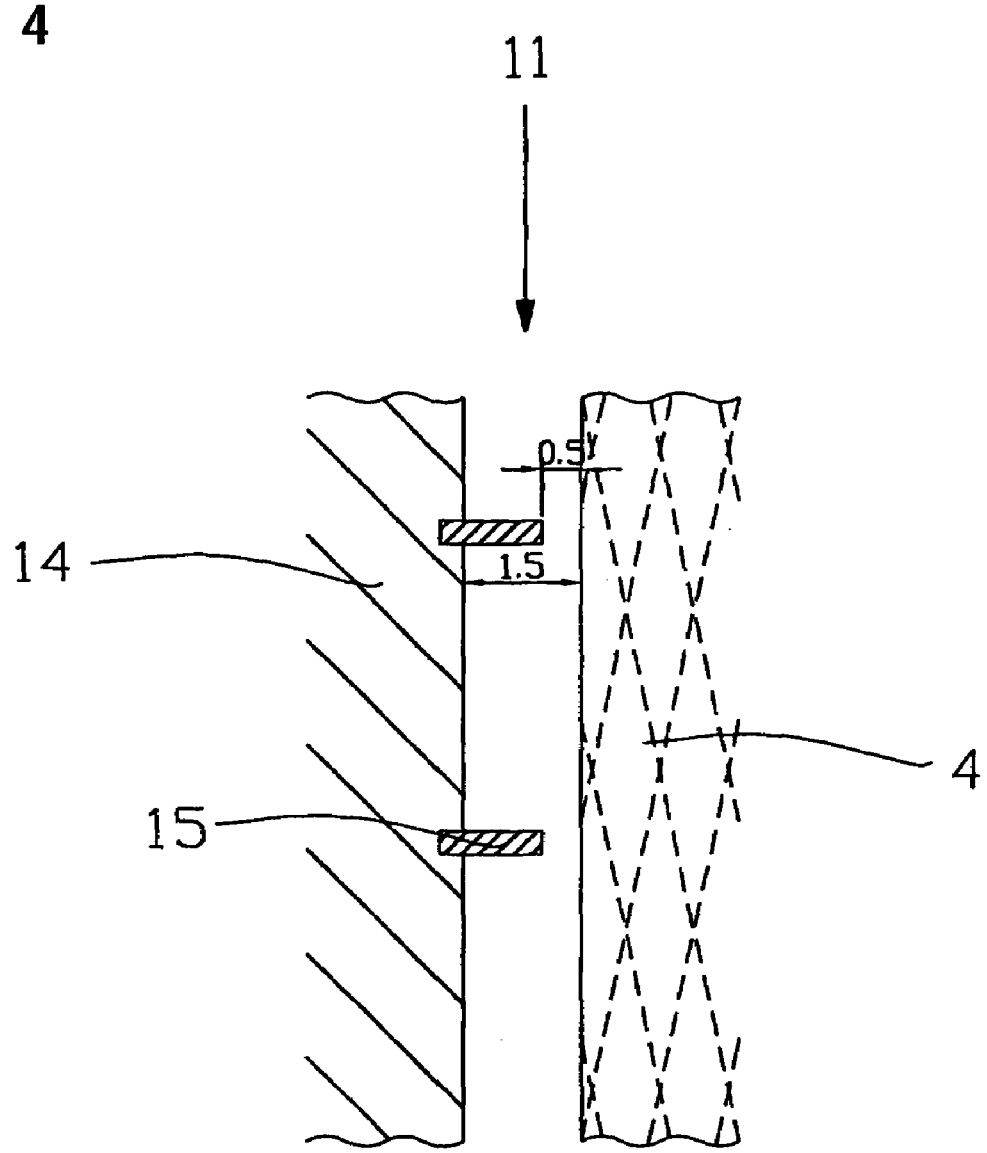
FIG. 4 shows a detailed sectional configuration of a labyrinth seal used in Example.

FIG. 4 shows a detailed sectional configuration of the labyrinth seal used in Example. The length between the lower end of the induction heating coil and the upper end of the labyrinth seal was set at 2500 mm. In a labyrinth seal 11, a sealing portion base material 14 was formed by heat-resistant hard rubber. A gap between the sealing portion base material 14 and the surfaces of the ingot 4 was set at 1.5 mm, a thickness of a throttle piece 15 made of heat-resistant rubber was set at 3 mm, and a distance between a throttle port and the ingot surface was set at 0.5 mm. The labyrinth seal 11 had the structure in which the eight throttle pieces 15 were stacked at 20-mm interval each.

A release rate of the argon gas from the labyrinth seal was set at 50 liter/min when the ingot 4 passed through the labyrinth seal. The computed difference in pressure between the inlet and the outlet of the seal portion was 0.00002 atm. The ingot taken out from the labyrinth seal 11 was cut to a predetermined length by a diamond cutter 13. Thus, the casting was continuously performed without interrupting the melting operation.

In the melting operation in Example, the quantity of the molten silicon in the water-cooled crucible was converted into the height of 240 mm. From an estimation of the impurity concentration in the silicon raw material, there was a fear that the ingot quality should deteriorate due to the impurity increase in the melt when the newly melted and produced ingot length reaches 4800 mm excluding the dummy ingot (for example, 0.1 ppmw in an Al component and 0.01 ppmw in an Fe component). Therefore, the charging of the melting raw material was interrupted when the length of the newly melted and produced ingot reached to 4800 mm, and the ingot was further withdrawn by 140 mm to solidify the melt of the ingot top portion while the melting electric power is decreased.

The silicon nitride partition having the thickness of 8 mm was placed on the solidified ingot top portion. The silicon nitride partition had the same cross section as the water-cooled crucible, and the silicon nitride partition was smaller than the inner wall surface of the water-cooled crucible by 2 mm. Then, the new raw material for melting was charged, and the melting re-started in the similar manner. About five hours were required for the time from the solidification start of the ingot top portion to the steady state after the start of the re-melting.

In the case where the partition plate is placed, the gap is formed between the partition plate and the water-cooled crucible wall, and the melt is caused to go around in the gap to eliminate the possible unevenness on the ingot surface. In Example, even if the gap of 2 mm was formed as described above, any material was not mixed from the lower side of the partition plate into the upper side, and the contamination of the already-existing melt to the new raw material for melting was not observed in the present invention.

The ingot having the length of about 14 m and the weight of about 950 kg was produced in the above-described way. The partition plate was inserted twice to eliminate the adverse influence of the impurity concentration on the melt in process of the melting. When the interruption time by the insertion of the partition plate was added, it took 170 hours in total.

On the other hand, in the case where the casting ended at the ingot length of 4 m because the impurity increased in the ingot top portion during the casting, it took about 80 hours for a furnace running cycle time per one casting when time for cooling, scrapping, and preparing for new melting were added. That is, in order to obtain the 14 m ingot, the casting time of 170 hours was required in the present invention while the casting time of 280 hours was required in the conventional casting method. It was clear that the productivity was largely improved by the application of the method of the present invention.

It was also clear that the same effect as Example was obtained by producing the polycrystalline silicon ingot with the water-cooled crucible induction melting-casting apparatus whose sectional structure is schematically shown in FIG. 3.

As described above, according to the polycrystalline-silicon casting method by the present invention, in the production of the silicon ingot used for the solar cell and the like, the productivity is largely improved, which allows the cost to be remarkably reduced in the solar energy generation. Therefore, the present invention can widely be utilized as the method for casting a polycrystalline-silicon ingot for the solar cell.

What is claimed is:

1. A method for casting polycrystalline silicon by a water-cooled crucible induction melting technique, comprising the steps of:

temporarily decreasing a crucible inside temperature once, inserting a partition means having an appreciably smaller cross section than that of said crucible on a top portion of a melt in the decreased temperature crucible;

charging a new raw material in solid form on an upper side of the partition means in a state where the melt on a lower side of said partition means is substantially shut off from the new raw material to avoid a mixture of said new raw material with the melt and resuming melting so as to continue melting and casting; and keeping the continuous casting while avoiding to mix the melt on a lower side of the partition means with the melt on an upper side of the partition means.

2. The method for casting a polycrystalline-silicon according to claim 1, wherein the partition means comprises a partition plate or a partition plate with legs.

* * * * *